United States Patent [19]

Vasile

[11] 4,044,321
[45] Aug. 23, 1977

[54] SURFACE ACOUSTIC WAVE BAND PASS FILTERING

[75] Inventor: Carmine F. Vasile, Thousand Oaks, Calif.

[73] Assignee: Rockwell International Corporation, El Segundo, Calif.

[21] Appl. No.: 662,761

[22] Filed: Mar. 1, 1976

[51] Int. Cl.² .................. H03H 9/04; H03H 9/26; H03H 9/32; H03H 9/30
[52] U.S. Cl. .................................... 333/72; 310/313; 310/366; 333/30 R
[58] Field of Search .................. 333/72, 30 R; 310/8, 310/8.1, 8.2, 9.8; 358/196

[56] References Cited
U.S. PATENT DOCUMENTS

| | | | |
|---|---|---|---|
| 3,559,115 | 1/1971 | De Vries | 333/72 |
| 3,659,231 | 4/1972 | De Vries | 333/72 |
| 3,908,137 | 9/1976 | Hunsinger et al. | 333/30 R X |
| 3,936,774 | 2/1976 | Mellon et al. | 333/30 R |
| 3,956,647 | 5/1976 | Mitchell et al. | 310/9.8 X |
| 3,972,011 | 7/1976 | Coussot et al. | 333/30 R |

Primary Examiner—Alfred E. Smith
Assistant Examiner—Marvin Nussbaum
Attorney, Agent, or Firm—L. Lee Humphries; Craig O. Malin

[57] ABSTRACT

Two piezoelectric filters are cascaded for suppression of bulk waves while mutually reinforcing surface wave band pass filtering. Each filter has an apodized central transducer and two outer transducers. In one instance the two outer transducers on one filter differ from the two outer transducers of the other filter with regard to bulk wave generation and reception. In another instance one filter provides asymmetric transmission and symmetry is restored by a wave slow-down for surface waves only. In still another instance the slow-down pad is provided also, but the signals in the two outer transducers are electrically inverted.

37 Claims, 8 Drawing Figures

SURFACE ACOUSTIC WAVE BAND PASS FILTERING

BACKGROUND OF THE INVENTION

The present invention relates to band pass filtering of electrical h.f. signals by means of solid state tuned devices. More particularly, the present invention relates to improvements in the art of band pass filtering using filter elements which include bodies of piezoelectric material, such a body being provided with electrodes for producing and responding to acoustic surface waves. Filter devices of this type are also called surfaceacoustic wave filters or SAW-filters for short.

A typical device of the character referred to above includes a more or less thin wafer of a piezoelectric material. Quartz is one of the "classical" piezoelectric substances; however, more recently Lithium-niobate crystals have been used because such a material has better properties, for example, as far as frequency selectivity is concerned. Such a wafer is provided on its surface with a first array of equidistantly spaced metal strips or fingers, which are interconnected by two transverse strips in that the fingers are alternately connected to these transverse strips to establish two interleaved or interdigitized combs. A second such array is provided on the same surface of the wafer, but being spaced from the first array in a direction transverse to the extension of the fingers; the fingers of both arrays extend in parallel to each other.

The metal fingers in the several arrays coact as electrodes with the piezoelectric material underneath, and each pair of interdigitized combs having these fingers establishes an electro-acoustic transducer. As an electrical signal is applied between the combs of one of the transducers, surface waves are set up and propagate to the other array (transducer), which develops a voltage between its combs. Such a device has an inherent frequency response (pulse response) which is centered at a frequency determined by the center-to-center spacing of the interleaved fingers of the transducers.

A simple comb pattern for each of the arrays produces a frequency response which has also significant side lobes. Thus, such a pair of transducers which are coupled acoustically by the piezoelectric wafer have multiple transmission bands. Through various techniques, not ably the so-called apodization, these side lobes can be suppressed leaving only a pronounced pass band. Apodization involves primarily contouring the overlap of the interdigitized fingers of the combs. The pattern determines and, actually, synthetizes the desired response, so that the off-band side lobes be suppressed.

Another aspect with regard to pass band synthesis is the use of a three transducer system, a central one and two outer ones on the same piezoelectric wafer. The primary purpose of using a three transducer system is to increase the overall gain of such a device. The finger spacing of the outer ones may differ slightly from the finger spacing of the central transducer to widen the pass band. The outer transducers may be operated as transmitters which are driven electrically in parallel, and the center transducer may receive acoustic waves from both transmitters to establish a single output. Conversely, the centrally positioned transducer acts as transmitter, which launches surface waves in opposite direction, and these surface waves are picked up by the two outer transducers.

Response and pass band synthesis has been quite successfully achieved in the past by means of these devices. However, they exhibit quite frequently rather disturbing side effects. The transducers as described do not just produce surface waves (Rayleigh waves) in the piezoelectric body, but compression and shear waves, also termed bulk waves, propagate into the interior of the piezoelectric body. They are reflected on the underside and reappear at the electrode bearing side of the body. Some of these reflected waves will reach the pick-up transducers and the latter will respond. It can readily be seen that some of these waves bounce back and forth between the opposite surfaces of the wafer. Such multiple reflection will cause significant attenuation, however, bulk waves which have been reflected but once will have significant strength when reaching a receiving transducer. These bulk waves cause deterioration of the off band rejection properties of the tuned device.

The generation of the bulk waves is a process quite different from the generation of a surface wave whose frequency is based on particular spacing of the fingers. Each finger produces also an incremental wave that propagates into the wafer, and the frequency of these waves has little relation to the finger spacing. As a consequence, the transmitting transducer produces waves outside of the desired pass band. These parasitic, spurious, off band side lobes in the frequency response may be only about 20 db, or even less, below the frequency response of the pass band. The acoustic transmission of a pass band signal is, therefore, interfered with by a dual transmission; a transmission via bulk waves is superimposed upon the transmission via surface waves.

A somewhat related problem is posed by the so-called plate modes of a rather high order. They are stimulated by the transmitting transducer(s) and are inevitably effective in the pick-up or receiving transducer(s). These plate modes contribute to the problem particularly if involving the same frequencies in the response of the device to bulk waves. In order to facilitate the present description, I shall include the plate modes in the bulk waves.

Another vexing problem of these solid state acoustic devices are the so-called multiple transit echos, notably the triple transit echo. This phenomenon is based on the reversibility of the interaction between the electrodes and the piezoelectric material; or, to say it differently, each transducer can act as transmitter and as receiver. Thus, a receiving transducer when stimulated will act as a retransmitting, echo-producing device. That echo is picked up by the transmitter proper and retransmitted again to be picked up by the receiver etc. Of course, the signal loses strength on each retransmission, but a signal that was bounced twice back and forth has strength only, say, twelve db down from the signal as it was picked up first. Since the echo has pass band frequency, it cannot be attenuated by frequency selectivity.

DESCRIPTION OF THE INVENTION

It is an object of the present invention to improve the filtering of electric h.f. signals by means of devices using acoustic wave surface waves.

It is another object of the present invention to improve solid state surface - acoustic wafer filter devices so as to reduce interference signal transmission by bulk waves and plate modes.

It is a further object of the present invention to reduce the effect of multiple transit of surface waves.

It is a specific object of the present invention to combine suppression of multiple transit signals with suppression of bulk wave responses.

It is a specific object of the present invention to provide a new and improved filter system with a pass band whose response is at least 50 db above interfering off-band responses.

In accordance with the preferred embodiment of the present invention, it is suggested to construct a filter circuit by electrically cascading two surface acoustic wave devices, which have similar frequency responses as to surface waves, but different responses as to bulk waves. In particular, the two devices are constructed to have a particular, preferably similar, mode of operation as regards the generation, transmission proper and pick-up of acoustic surface waves, but one of the devices includes a modification at least in regard to generation, transmission and/or pick-up of bulk waves, without modifying the overall characteristics of surface wave transmission but causing differing overall characteristics with regard to bulk wave transmission so that upon cascading the two devices either is less transmissive in regard to bulk waves transmitted by the respective other one. The differences must be sufficient so that the bulk wave pass band of one filter falls into a frequency region in which the other device does not have significant response and vice versa. For filters to be used in i.f. circuits for television receivers that difference should be at least about 20 db.

It is preferred to use filter devices or elements with three transducers on a substrate, the central one transmitting to or receiving from the two outer transducers. Each device or element is constructed generally so that the two transmission paths for surface waves are similar. Unfortunately, this holds true also for the bulk waves and plate modes. Hence in accordance with the invention, it is suggested to disturb this similarity or symmetry in one of the devices to effect both, bulk waves and surface waves and to restore similarity or symmetry, at least as far as the resulting electric output is concerned, but for the surface waves only. Another way of introducing operative differences in the two cascaded devices is to construct each of them symmetrically, but to introduce into the electrode patterns differences, which will not affect the pass band as to surface waves but will introduce differences in the generation or pick-up of the bulk waves. Particularly, the central transducers of the two devices may have similar configuration, but the outer transducers in one device may be larger than the outer transducers in the other device. For example, the outer transducers in one filter device may have about twice the number of fingers than the outer transducers have in the other device. As a consequence, the transmitting or receiving (antenna) lobes for bulk waves by and of the outer transducers differ in the two filter devices.

Broadly speaking, each filter device with three transducers establishes two parallelly effective paths for acoustic waves each of which includes a surface wave branch and a bulk wave branch. The two parallel paths of a device are electrically connected for operation in parallel. Differences are introduced in the relationship between the branches for surface waves and the branches for bulk waves so that upon cascading the devices the frequency responses based on surface wave transmission coincide and, therefore, mutually reinforce each other while the frequency response based on bulk waves are mutually off band. This is specifically accomplished by the introduction of differences in the relation between the respective surface and bulk wave branches in the devices or by a selective asymmetry in the parallel paths in one device with restoration of symmetry for surface waves only, or by different transducer configurations affecting the equivalent antenna lobes for bulk waves only and not the generation or pick-up of surface waves.

From a still different point of view, operative differences of the filter devices can be introduced by making the relative effective length and/or orientation of the propagation path for bulk waves (relative to the length of such a path for concurrently produced waves) different in the two devices. For example, in one (three transducers) device the effective length for surface waves to (or from) one outer transducer is changed by half a wave length (or an odd multiple thereof) as compared with the path length for surface waves to or from the other outer transducer of the same device, and either by modifying the orientations of the transducers or by way of particular electric signal summation, the proper phase relation of the surface waves is restored causing the (symmetrical) bulk waves to cancel; they do not cancel in the other device. Alternatively, the geometric path length for bulk waves of the propagation speed for bulk waves is chosen differently by using differently thick or differently cut wafers.

The triple transit echoe can be suppressed by introducing a quarter-wave length travel path differential into the cascaded filter elements so that the triple transit echo (making one round trip in addition to the regular signal) of one filter element is compensated by the echo produced by the other filter elements, because the two echos are now 180° out of the phase. This change in travel path length does not materially influence the pass band response.

A three-transducer filter assembly is usually provided with a wide, apodized central transducer and two smaller unapodized transducers. It was found that the apodization of the central transducer should have a maximum finger overlap in the center, diminishing to minima on both sides, followed respectively by one smaller maximum on each side, diminishing overlap towards the ends with a rapid increase in overlap right at each end. This apodization curve permits a relatively narrow construction for the central transducer and thus the triple transit time rejection is improved.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 1a and 1c show details on an enlarged scale and as indicated in FIG. 1;

FIG. 1b is a cross-section as indicated in FIG. 1a;

FIG. 2 is a schematic representation, block and circuit diagram of a filter cascade;

FIG. 4 is a cross-section in representation of a difference in wafer thickness;

Figure 1:
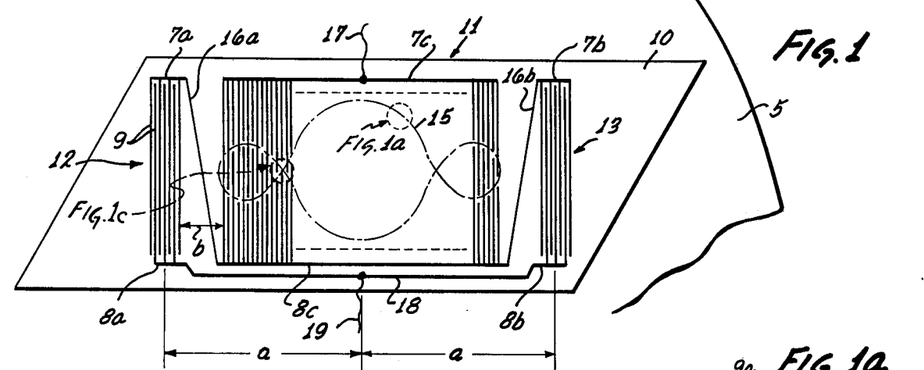
FIG. 1 is a plan view of a filter device used in a cascade system in accordance with the preferred embodiment of the present invention.

Proceeding now to the detailed description of the drawings, a typical individual filter device to be used for practicing the invention is shown in FIG. 1. Such a device includes a flat piezoelectric wafer 10 made, for example, of Lithium-niobate and having the contour of a parallelogram with long sides and obliquely positioned transverse sides. This wafer is bonded to a suitable support, header 5. The bond 4 (FIG. 1b) is provided by a material, which also absorbs acoustic waves, e.g. rubbery adhesive or epoxy.

Figures 1A, 1B, 1C, 2, 4:
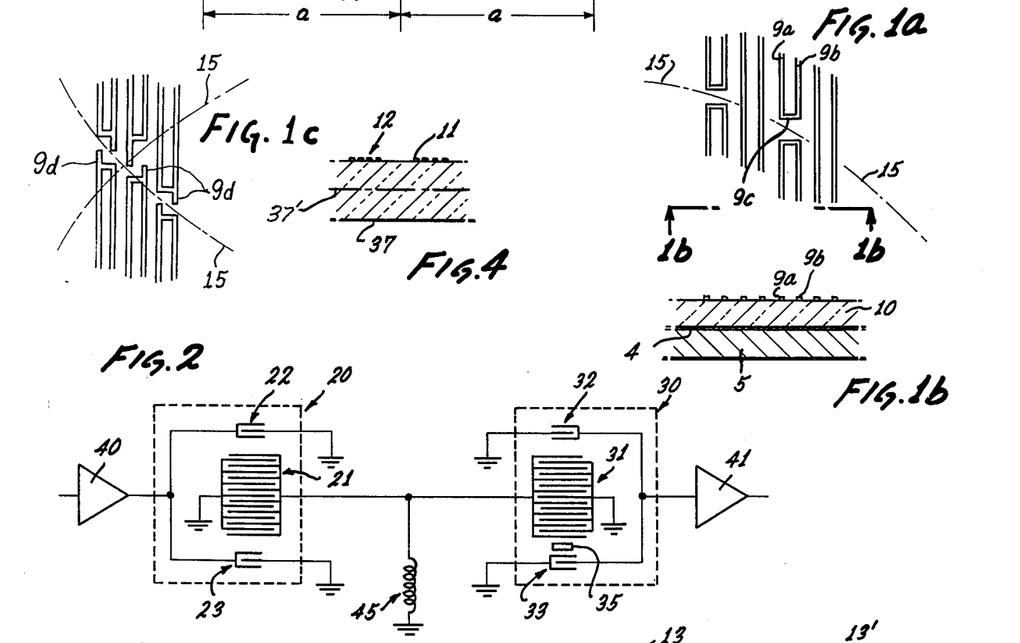

The visible surface of the wafer carries three arrays of interdigitized contact fingers 9 for respectively establishing three transducers 11, 12, and 13. The fingers are in intimate contact with the surface of wafer 10 and may have been provided thereon by a suitable metallization process. The fingers are spaced apart (center to center distance) by half a wave length of the pass band center frequency of this particular filter. Each finger may actually be split in two line elements, such as 9a, 9b, joined at the end by a bridge 9c, and the line elements will then be spaced by a quarter wave length accordingly. The fingers are shown as single lines in FIG. 1, but the enlarged view of FIG. 1a shows the details of finger construction.

The fingers 9 extend at right angles from transverse strips, such as 7a and 8a to establish two interdigitized combs constituting the transducer 12. The interdigitized fingers extending from transverse strips 7b and 8b establish the transducer 13.

The transducers 12 and 13 have a similar number of fingers (e.g. sixteen, that is, 32 lines, such as 9a, 9b, etc.) and have otherwise similar dimensions to be identical in function and operation. The transverse strips (8a, 8b) of the two transducers 12, 13 are interconnected by a metal strip 18 being of sufficient width to permit connection (soldering) of a lead, such as 19, to serve as common signal input or output for the two transducers.

The two strips 7a and 7b are additionally connected to a strip 8c by means of oblique strips 16a and 16b, and one set of fingers of transducers 11 extend from this strip 8c. This common strip pattern 7a, 16a, 8c, 16b, 7b, is connected to ground. These strips 16a, 16b may be omitted, if it is desired to connect the one comb of each transducer separately and individually to ground. A second set of fingers of transducers 11 extends from a strip 7c. The transverse strip 7c for transducer 11 is connected to a lead 17 to serve as input or output for an electrical signal.

The transducer 11 is apodized, i.e. the ends of the fingers do not extend all the way to the respective opposite, transverse strip, but each finger ends just short of a finger extending from that opposite transverse strip. The resulting gaps delineate a particular curve 15, representing the desired frequency response. The fingers overlap only inside of the area delineated by the curve 15. The details of this apodization curve 15 are not important for the purpose of the present invention, however, a few remarks concerning the apodization are in order. The curve 15 is actually composed from gaps which delineate sine wave portions, but the curve does not follow a single sinx/x contour. The gaps establishing the curve 15 are shown only in the left hand portion of FIG. 1; the gap pattern is continued throughout the finger arrays of transducer 11, and the curve 15 is delineated by a dash dot line for representing the gaps between the electrode fingers as extending from opposite strips (7c, 8c). Transducer 11 may have thirty-one finger pairs, each pair being defined by two aligned fingers extending from opposite strips (7c, 8c).

The apodization curve 15 delineates finger overlap. That overlap has a maximum in the center of the transducer 11; the overlap diminishes on both sides of the maximum down to zero overlap, being actually crossovers of the lower and upper apodization curve portions and leading towards two smaller maxima. The overlap is again reduced from these maxima towards the ends of the transducer, but jumps to a larger overlap right at the ends of the transducer, the jump being just a little smaller than either of the two small maxima of overlap. It was found that multiple side lobes in the apodization curve are not really needed, so that the transducer is not very wide.

FIG. 1c illustrates in detail one end region of transducer 11. The FIGURE shows moreover that for purposes of increasing the resolution in the definition of the apodization curve, the line elements of the fingers may be used individually. FIG. 1c shows specifically three finger pairs close to the one end of transducer 11, whereby one line element of each finger has an additional extension, such as 9d and the outermost fingers consist actually of a pair of single line elements establishing the overlap jump at the transducer end called for above.

The transducers 12 and 13 are spaced from the central transducer 11 (dimension of the gap b) by a distance which is in excess of the extension of the acoustic storage field, but as close as possible to reduce the overall transit time for surface waves. The character a denotes the similar center to center spacings of the central transducer from the outer transducers. FIG. 1 is representative of the general design for a surface acoustic wave filter device or element as preferred. Further particulars and modifications needed to accomplish the objective of the invention will be discussed below.

Turning now to FIG. 2, a cascaded filter system is shown which includes two piezoelectric acoustic surface wave filters 20 and 30. The filters are interconnected for cascading by a coupler network 45 providing power match between the output of filter 20 and the input of filter 30. The coupler network 45 may consist of a single coil; one could employ other devices, such as pie network or any other circuit network suitable for power-matching the two filter devices with small losses and little influence on the pass bands. Filter 20 is driven by an input amplifier 40, providing a broad band signal to be filtered. Such a signal may, for example, be generated in the i.f. range of a TV set. Filter 30 has its output connected to an output amplifier 41 for further signal processing.

Each of these filter elements consists of a substrate made of a piezoelectric crystal, such as a wafer of LiNbO$_3$ as outlined above. The surface of each crystal is provided with patterns of metallization strips which constitute electrodes for establishing transducers. These strips or fingers are arranged to establish three acoustically linked transducers, as shown in principle and by way of example in FIG. 1.

The filter element 20 has a central transducer 21 and two outer transducers 22, 23 corresponding essentially to the construction of FIG. 1, except that each transducer is shown with a separate ground connection for one of its combs. The finger pattern and comb structure has been greatly simplified for purposes of illustration only; each transducer has, of course, more than three fingers (e.g. 16 for the outer ones, almost twice that number for the central transducer).

The symmetrically arranged electrodes of the two outer transducers 22 and 23 are interconnected on the wafer (strip 18 - FIG. 1), and the lead thereof is connected to the output terminal of amplifier 40 serving as the source for the signals which are to be passed through the filter arrangement. The respective other electrodes of the transducers 22 and 23 are deemed connected to the return terminal of the amplifier 40, e.g they are grounded.

These two transducers 22, 23 are, thus, operated as acoustic transmitters, and they are energized in unison, i.e. in synchronism particularly as to phase; they intereact with the piezoelectric substrate of the filter device to generate, among others, surface waves of the particular frequency. These surface waves or Raleigh waves propagate towards the center of the substrate surface of the filter device to interact with the third, centrally located transducer 21, serving here as receiver for the surface waves.

The device 20 has strictly symmetrical configuration, so that the two, separately produced, acoustic transmissions and the corresponding pairs of transmitter and receiver (the latter being shared) operate in parallel and in phase synchronism. The receiver 21 is apodized as outlined above, i.e. its electrode fingers have an overlap pattern designed to reduce the effect of side lobes in the filter, leaving a pronounced pass band about the center frequency as determined by the finger spacing. The one set of finger electrodes (comb) of the transducer 21 is also connected to ground, while the other set or comb is connected to the output terminal of this particular filter.

As was mentioned earlier, the two transmitting transducers 22, 23 do not just excite the surface of the crystal wafer, but each electrode emits also compressive waves into the interior of the wafer. The finger pattern establishes a certain lobe system for such waves equivalent to antenna lobes. These waves are reflected by the bottom, i.e. the opposite substrate surface. A good acoustic-bond, i.e. a bond which absorbs the incident bulk waves impedes significantly the reflection of these waves, but still sufficient acoustic energy is reflected and emerges in various places of the active surface of the substrate including the region occupied by the receiver 21 Accordingly, the receiver is stimulated by these bulk waves.

The frequency spectrum of these bulk waves is not completely determined by the electrode spacing, but some waves thus produced may fall into the pass band. However, in most instances the bulk waves set up their own pass band which becomes a side lobe, or spurious response band in the frequency response of the filter, materially disturbing its operation! High order plate modes will add to the spurious response, so that the maximum off band - response of the filer is less than 20 db down from the response in the center frequency of the pass band.

It has to be observed that those bulk waves which do not appear in the pick-up transducer 21 and set up the afore-mentioned side lobe in the response of the filter device are waves which are symmetrical, because the two transmitting transducers are energized in phase synchronism and only phase-coherent waves as received by the central transducer 21 will produce an electrical output. Bulk waves produced separately by the two transducers 22, 23 and energizing the receiving transducer 21 in phase opposition cancel each other. Thus, a parasitic, spurious off band response in such a three transducer device is due primarily to symmetric bulk waves.

The second device 30 is provided to reduce the effect produced by bulk waves materially, so that e.g. the total effective spurious response of the cascade is more than 50 db down from the response for the center frequency of the pass band.

The device 30 is similar to the device 20 in many details of structure and overall operation. For example, the device has a central transducer 31, which is established by a pattern of electrode fingers identical to the pattern of transducer 21 on device 20. Also, the substrates are of the same cut and have the same thickness. The finger spacing is the same so that the devices have identical center frequencies. The apodization pattern is the same so that the side lobes of the frequency response due to surface waves are attenuated in the same fashion.

Still analogously, the device 30 has a first, outer transducer 33 quite identical in pattern with transducer 23 and being arranged from the center transducer in exactly the same manner. (A modification as to spacing will be discussed below). However, the second, outer transducer 33 exhibits a certain difference. The finger patterns are still the same (as compared with the pattern of transducers 12, 13, 23) but the arrangement on the substrate is reversed, so that the operation of transducer 33 is 180° out of phase as compared with operation of transducer 33.

If the outer transducers were used as transmitters, they would produce out of phase signals of the center frequency which would cancel at the central receiver. Presently, the central transducer 31 is used as transmitter, so that (without further measures) the receivers would receive out of phase signals. The inversion of function with regard to transmission and pick-up of surface acoustic waves in the two filter elements 20, 30 moreover has no bearing on this point of operation. The transmitting and receiving functions are inverted in the two filters, so that for cascading the two filters the centrally located pick-up transducer 21 of the first filter 20 can be directly connected to the central transducer 31 of the second filter. Such a connection facilitates power matching the two devices and it requires, of course, that the central transducer of the second cascade stage be operated as transmitter. However, without further measures, filter device 30 would actually suppress the pass band entirely, because the pick-up transducers 32, 33 receive 180° out of phase pass band signals, and they are electrically connected in parallel with a common output line of the resulting signal.

In order to avoid the afore-mentioned signal cancellation and to restore the desired in-phase operation of transducers 32 and 33, one may, for example, provide a slow-down pad 35 in the path for surface waves from the central transducer 31 to one of the outer ones, for example, transducer 33. The choice is basically arbitrary. The pad is a thin metallization made, for example, of the same type used for the electrode and, possibly, also of the same thickness. The main rule is that the layer must be significantly thinner than the wave length of the surface waves in the transmission band. If the center frequency is between 40 and 50 MHz or thereabouts a pad of 2000 A thickness, being the usual thickness for the fingers, readily meets this requirement.

As stated, the substrate for the filter device is, for example, LiNbO$_3$. An aluminum pad of the stated thickness will reduce the surface wave velocity but about two and a half percent. The length of the pad taken in the direction of propagation of the surface should be such that the waves are slowed to compensate the 180° phase difference for the two surface waves on account of the phase reversal in the positioning of one of the outer transducers relative to the other one. That length is given by half the wave length multiplied by ($V/\Delta V - 1$), wherein V is the speed of Raleigh waves of a Lithium Niobate surface and $\Delta V$ is the speed reduction on account of the aluminum pad. Typically, the pad 35 is about twenty wave lengths long.

By placement of the pad 35 one introduces a phase shift of 180° for any wave having center frequency of the pass band of the surface waves. Thus, proper phase relation in the two-pick-up transducers 32, 33 is readily restored, and their outputs can be summed by tying their nongrounded output terminals together, and they now can be connected to a suitable output amplifier 41.

The placement of the pad 35 does not affect the transmission bulk waves or plate modes. Thus, many of the symmetrical bulk waves as generated by transducer 31 stimulate the transducer 32 in phase opposition to the stimulation of transducer 33. Since the two outer transducers have their outputs tied together, these bulk waves cancel. Accordingly, the device 30 has a parasitic side lobe or spurious response band in its frequency response that represents only the transmission of any asymmetric bulk wave of this particular (three) transducer device; the corresponding asymmetric bulk waves cancel in device 20.

It was found that the response of the cascaded device in the common pass band is more than 50 db up from the highest interfering residual side lobe resulting from the bulk waves, because these side lobes or spurious response bands are sufficiently offset in the two devices 20, 30. Hence, upon cascading them, either device does not enhance the side lobe of the other and vice versa.

It can thus be seen that the principle employed in the example above is the introduction of a particular structural asymmetry in just one of the devices which affects both, surface and bulk waves, while symmetry of the two transmission paths are restored for the surface waves only. From a different point of view, the two devices 20, 30 are constructed to be similar as much as possible and to establish similar responses to surface waves, but they differ in that one device has a parasitic side lobe on account of asymmetric bulk waves but occupying a different frequency range.

The two filters 20 and 30 may differ in still another point, which does not affect the surface wave transmission, but adds to the differences in regard to transmission of bulk waves. The main purpose of this difference, however, is to suppress the triple transit echo. In order to recapitulate, the triple transit echo is produced as follows:

As the transducer such as (FIG. 1) or 22 (FIG. 2) launches a surface wave, such wave propagates first to pick up transducer 11 (or 21 in FIG. 2) to generate an electrical signal. Additionally, however, the pick-up transducer generates an echo wave which returns to transducer 12 (or 22) and is picked up there, whereupon another echo is produced which soon reaches the central pick-up transducer. Thus, for each pick-up signal it receives transducer 11 (FIG. 1) or 21 (FIG. 2) receives also a delayed signal (of the same frequency), the delay being equal to the time for one round trip between the transducers.

The same triple transmit echo occurs in the filter 30. The asymmetry in its construction does not affect the triple transit signal. The phase inversion produced by transducer 32 relative to transducer 33 is precisely offset by the pad 35. Thus, the echo signals from the two branches add constructively in the pick-up transducer 31.

Each filter, therefore, produces its own triple transit echo; without further measures, they will thus be added and pass the filter arrangement because they do fall into the pass band. However, the situation is different if one introduces the following differences for the two filters.

The center to center distance $a$ between the central transducer and the outer transducer (see FIG. 1) is to be different by one quarter wave length ($\lambda/4$) for the two filters. Thus, the center-to-center transducer distance in filter 20 should be equal to the center-to-center transducer distance in filter 30 plus or minus $\lambda/4$. This difference is transducer spacing has the following effect.

Filter 20 produces a particular triple transit echo which will also be transmitted to transducer 31 in filter 30. The same signal that caused the echo in filter 20 will have reached filter 30 a little earlier and will produce its own triple transit echo therein. That last produced echo has, however, a different travel path for the echo produced by and in filter 20, the difference being precisely twice a quarter wave length, i.e. half a wave length. Consequently, the echo produced by filter 20 and introduced as a signal in filter 30 is 180° out of phase to the echo produced by filter 30. Thus, the two echos cancel.

It can readily be seen that the slight difference in transducer spacing affects also the transmittance of bulk waves, and the resulting difference becomes noticeable in a difference in bulk wave response. The effect is not very significant, but the triple echo suppression has at least some synergism with the bulk wave suppression in the device. At the very least, these two operations do not interfere with each other.

Figure 3:
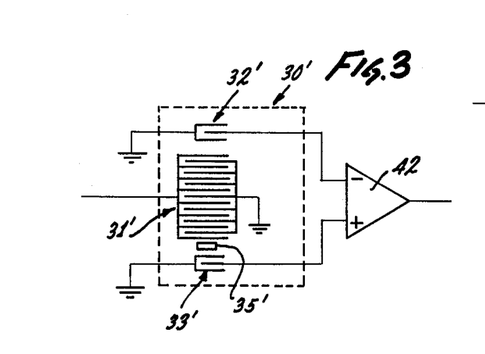
FIG. 3 is a circuit diagram showing a modification for the circuit of FIG. 2.

FIG. 3 illustrates a modification for the circuit of FIG. 2, involving particularly the second stage in the filter cascades, denoted 30'. The transducers 31 and 31' as well as transducers 33 and 33' are similar in construction and disposition, but the phase reversal of the third transducer denoted 32' in FIG. 3 has not been maintained. In other words, the two transducers 32' and 33' would operate in synchronism, but the pad 35 is still provided and shifts the response of the two transducers by 180° relative to each other. On the other hand, the signal bearing electrodes of the two transducers 32', 33' are separated from each other, (which amounts to an omission of the connecting strip 18 from the representative construction shown in FIG. 1). Instead, the two transducer signals are fed to an amplifier 42, which phase inverts one of its inputs relative to the other one. Thus, the pass band response is restored electrically and correspondingly the symmetric bulk waves are electically eliminated.

The bulk waves can be attenuated by a cascade circuit of filters which differ otherwise. For example, the electrode patterns on both substrates could be identical and as shown in FIG. 1, but the wafers (substrate) could be differently thick. This difference in thickness is schematically denoted in FIG. 4, showing the regular substrate thickness in dash-dotted lines, 37 ' corresponding, for example, to the thickness of the device as shown in FIG. 1b, while the solid line 37 denotes the bottom of a thicker substrate for one of the filters. The surface waves are not at all affected by the different choice in thickness, so that the frequency response of the cascade is the square of the response of each individual device as far as the surface waves is concerned. However, the plate modes and the phase mode velocity for the two devices differ as the bulk waves have differing propagation lengths. As a consequence, the two devices have differing bulk wave responses. The situation is quite similar if one uses different cuts in the crystal because bulk wave speed is anisotropic in lithium niobate.

It should be mentioned, however, that the construction of devices which differ on account of differences in the piezoelectric substrate is of lesser economic interest, because of increased production cost. The example described above the references to FIGS. 2 and 3 was based solely on difference in surface pattern configuration which means that one merely needs different masks for photolithographically making the desired metallization pattern on the substrate. The process remains the same otherwise.

Commensurate with the foregoing, differences in the devices can be established in still other ways, whereby again only the surface of the devices is affected. The particular cascade shown in FIG. 5 constitutes actually the best mode of operation of the preferred embodiment of the invention. The cascade shown in FIG. 5 is again connected between the output of amplifier 40 and the input of amplifier 41. The cascade is comprised of two filter elements 43 and 44, each of which can be deemed directly represented by the configuration shown in FIG. 1. They differ, however, in that the number of electrode fingers in the outer transducers 12, 13 in filter 43 is e.g. about twice the number of fingers in outer transducers 12', 13' of filter 44. By way of example, the transducers 12 and 13 each may have sixteen fingers, while the transducers 12', 13' each have only nine fingers. The central transducers have 31 fingers each.

Figure 5:
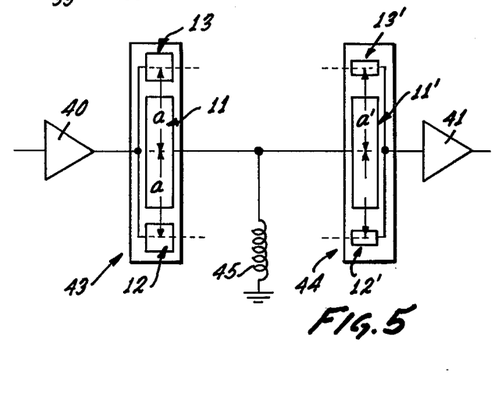
FIG. 5 is a schematic representation, block and circuit diagram of another filter cascade.

As a consequence, the bulk wave emission pattern (antenna lobes) of filter 43 is substantially different from the bulk wave reception pattern (antenna lobes) of filter 44, while the surface wave responses are hardly affected by this difference. Off - pass band, spurious responses on account of the bulk waves actually occupy different bands, each being about 20 db above the corresponding response for similar frequencies of the respective other filter. As the two filters are cascaded, the overall off band response is significantly improved.

Again, the two filter elements differ additionally by the transducer spacing in that the center-to-center spacing $a$ between transducers 11 and either of the transducers 12, 13 is larger by about one quarter wave length (at pass band center frequency) than the corresponding spacing $a'$ between transducer 11' and each of the transducers 12' and 13', so as to obtain the triple transit echo suppression outlined above.

The invention is not limited to the embodiments described above, but all changes and modifications thereof not constituting departures from the spirit and scope of the invention are intended to be included. Among these modifications are, for example, the following. The filter modifications have been explained with reference to the second cascade stage in each instance, but the filters could change place in all cases. Also, the cascade connection could be provided by tying the respective outer transducers together. Upon using the signal phase shift type principle as explained with reference to FIG. 3, one will need phase shifting (inverting circuitry) in one of the connecting branches.

Each of the cascades described above can be cascaded again, i.e. one can provide a four filter element cascade to obtain still further suppression of parasitic side lobes and improved filtering accordingly.

I claim:

1. A band pass filter for h.f. electrical signals, comprising:
a first acoustic surface wave device, having at least two transducers coupled to each other by a piezoelectric body, a first one of the two transducers receiving an electrical signal, the other of the two transducers generating an electrical signal in response to surface waves generated by the first transducer and transmitted by the piezoelectric body, the device having a particular frequency response which includes a particular pass band on account of the signal transmission through surface waves, the device having an additional frequency band outside of the said pass band on account of bulk waves;
a second acoustic surface wave device having at least two transducers coupled to each other by a piezoelectric body, a first one of the two transducers of the second device receiving an electrical signal, the other one of the two transducers of the second device generating an electrical signal in response to surface waves generated by the first transducer of the second device and transmitted by the piezoelectric body thereof, said second device having a substantially similar frequency response and a substantially similar pass band as said first device with regard to surface waves but differing frequency responses with regard to bulk waves; and
circuit means for connecting the second transducer of the first device to the first transducer of the second device to obtain a filter cascade in which said particular pass band of said first device and said substantially similar pass band of said second device coincide and are being cascaded and the bulk wave response of one of the devices is outside of the band pass and off the bulk wave response of the respective other one of the devices and vice versa.

2. A band pass filter as in claim 1, wherein one of the transducers of each device has two interdigitized apodized combs of finger electrodes, the two apodized transducers each having a particular number of finger electrodes and being similarly constructed, the respective other transducer of each device having also two interdigitized combs of finger electrodes but a smaller number of fingers than the said particular number, the two other transducers having a different number of fingers to obtain said differing bulk wave response.

3. A band pass filter as in claim 1, wherein the relative path lengths for surface and bulk waves differ in the two devices.

4. A band pass filter as in claim 1, wherein the piezoelectric bodies are differently thick.

5. A band pass filter as in claim 1, wherein the two bodies have differently oriented crystal structure in relation to the surfaces.

6. A band pass filter as in claim 1, wherein the transducers of each device have particular spacing; the spacing between the transducers of the first device differs from the spacing between the transducers of the second device by a quarter of a wave length.

7. A band pass filter for h.f. electrical signals, comprising:

a first surface acoustic wave device having a central and two outer transducers placed on the surface of a first piezoelectric body and establishing two parallel transmission paths for acoustic waves, each path having a surface wave branch and a bulk wave branch;

first circuit means connected to the transducers for operating the said paths in parallel to obtain a particular frequency response which includes a pass band and a spurious response band based on the bulk waves;

a second surface accoustic wave device having a central and two outer transducers placed on the surface of a second piezoelectric body and establishing two parallel transmission paths for acoustic waves, each path having a surface wave branch and a bulk wave branch;

second circuit means connected to the transducers of the second device for operating the said paths in parallel to obtain a particular frequency response which includes a pass band and a spurious response band based on the bulk waves;

the transmission for bulk waves in the second device being different from the transmission for bulk waves in the first device, so that the spurious response bands based on bulk waves differ; and circuit means including the first and second circuit means for connecting the devices in cascade.

8. A filter as in claim 7, wherein the effective path lengths for surface waves between the central and the outer transducers on the second device differ by 180° as to a center frequency of the said pass band, said second circuit means restoring electrically phase coherency of electrical signals in the parallel connection as provided by the second circuit means.

9. A filter as in claim 7, wherein said outer transducers on the first device have antenna-lobes as to bulk waves which are different from antenna-lobes as to bulk waves of the outer transducers on the second devices.

10. A filter as in claim 9, wherein said transducers are established by interdigitized combs, the combs of the outer transducers of the first device having a different number of fingers as the combs of the outer transducers of the second device.

11. A filter as in claim 10, the different numbers of fingers having approximately a ratio of 2 : 1.

12. A filter as in claim 7, said difference in effective path length being provided by a pad on the surface of the second body at a location between the central transducer and one of the outer transducers of the second device.

13. A band pass filter for h.f. electrical signals comprising:

a first surface acoustic wave device having a central transducer and two outer transducers placed on the surface of a piezoelectric body and symmetrically with regard to transmission of surface waves and bulk waves between the central transducer and the two outer transducers;

a second surface acoustic wave device having a central transducer and two outer transducers on the surface of a second piezoelectric body but asymmetrically with regard to the transmission of surface waves and bulk waves between the central transducer and the two outer transducers;

means connected for cascading the two devices; and means coupled to the second device for restoring symmetry in the transmission in regard to surface waves only.

14. A filter as in claim 13, wherein said two outer transducers of the second device are spaced for 180° out of phase operation with regard to the signal transmission of surface waves in the second device; and circuit means connected to the second device to restore electrically phase coherency as between signals operating the outer transducers.

15. A filter as in claim 12, wherein said two outer transducers are placed for 180° out-of-phase operation with regard to the signal transmission; and means on the surface of the device to restore phase coherency of operation as to surface waves, so that symmetric bulk waves remain 180° out of phase.

16. A band pass filter for h.f. electrical signals comprising:

a first surface acoustic wave filter device having a first pair of interdigitized combs on the surface of a first piezoelectric body and a second pair of interdigitized combs on the body, for the transmission of surface acoustic waves from the first pair to the second pair within a particular pass band having a center frequency defined by the said combs, the first and second pairs of combs each defining antenna-like lobes in regard to bulk waves travelling through the body from the first pair to the second pair, resulting in a particular frequency response band for bulk waves appearing at least partially outside of said pass band;

a second surface acoustic wave filter device having a first pair of interdigitized combs on the surface of a second piezoelectric body, and a second pair of interdigitized combs on the second body for transmission of acoustic surface waves from the first pair of the second device to the second pair thereof and within a particular pass band being substantially similar to said pass band of said first devices, the first and second pair of combs of the second device each having also antenna-like lobes in regard to bulk waves travelling through the second body from the first pair to the second pair of combs of the second device resulting in a particular band for bulk waves which is off the band for bulk waves of said first device; and circuit means for connecting the second transducer of the first device to the first transducer of the second device to obtain a filter cascade in which the said pass bands coincide and are being cascaded while the bulk wave reponse of one of the devices is outside of the pass band and off the bulk wave response of the respective other one of the device and vice versa.

17. A filter as in claim 16, wherein one of the pairs of combs each of the two devices have substantially similar numbers of apodized comb-fingers, while the respective other two pairs have dissimilar numbers of comb fingers, so that the said lobes in the two devices are different from each other.

18. A filter as in claim 17, wherein said dissimilar numbers differ by about 2 : 1.

19. A filter as in claim 16, said first pair being spaced from said second pair on the first device by a distance which differs from spacing of the first and second pair on the second device by a quarter of a wave length.

20. A band pass filter for h.f. electrical signals, comprising:

a first surface acoustic wave filter device having a first pair of interdigitized combs on the surface of a first piezoelectric body and second and third pairs of interdigitized combs disposed on the body in symmetric relation to the first pair for the transmission of surface acoustic waves between the first pair and the second and third pairs and establishing a particular pass band having a center frequency defined by the said combs, the second and third pairs of combs each defining antenna-like lobes in regard to bulk waves travelling through the body between the first pair and the second and third pairs, resulting in a particular frequency response band for bulk waves appearing at least partially outside of said pass band;

a second surface acoustic wave filter device having a first pair of interdigitized combs on the surface of a second piezoelectric body, and second and third pairs of interdigitized combs on the second body for the transmission of acoustic surface waves between the first pair of the second device and the second and third pairs thereof and establishing a particular pass band, being substantially similar to said pass band of said first device, the second and third pairs of combs of the second device each having also antenna-like lobes in regard to bulk waves travelling through the second body between the first pair and the second and third pairs of combs of the second device resulting in a particular frequency response band for bulk waves which is off the band for bulk waves of said first device; and circuit means for connecting the first transducer of the first device to the first transducer of the second device to obtain a filter cascade in which the said pass bands coincide and are being cascaded, while the bulk wave response of one of the devices is outside of the pass band and off the bulk wave response or the respective other one of the devices and vice versa.

21. A band pass filter as in claim 20, whrerein both of the first pairs of combs are apodized, the second and third pairs of the first device each having a number of comb fingers as being different of the number of fingers of the second and third pairs of the second device.

22. A band pass filter as in claim 20, wherein the effective-surface distance between the first and second pairs of one of the devices differ by half a wave length from the distance between the first and third pairs of the one device, and circuit means connected to the second and third pairs of the one device for establishing phase synchronism of the operation of the second and third pairs of the one device.

23. A band pass filter as in claim 22, wherein said second and third pairs of the one device operated 180° out of phase, the circuit means connecting them directly together.

24. A band pass filter as in claim 22, wherein said second and third pairs of the one device operate in phase, the circuit means providing a phase inversion of signals as effective on the second and third pairs.

25. A band pass filter as in claim 20, said bodies being differently thick.

26. A band pass filter as in claim 20, said first pair being spaced from said second and third pairs on the first device by similar distances, differing from spacing between the first pair on the second device and the second and third pairs thereon by a quarter wave length of said center frequency.

27. A band pass filter for h.f. electrical signals, comprising:

a first surface acoustic wave filter device having a first pair of interdigitized combs on the surface of a first piezoelectric body and a second pair of interdigitized combs on the first body spaced by a particular distance from the first pair, for the transmission of surface acoustic waves from the first pair to the second pair within a particular pass band having a center frequency defined by the said combs, the device producing a triple transit echo;

a second surface acoustic wave filter device having a first pair of interdigitized combs on the surface of a second piezoelectric body, and a second pair of interdigitized combs on the second body spaced by a particular distance from the first pair of the second device for the transmission of acoustic surface waves from the first pair of the second device to the second pair thereof and within a particular pass band, being substantially similar to said pass band of said first devices, the spacing between the first and second pair of combs of the first device differing from a spacing between the first pair and the second pair of combs of the second device by a quarter wave length of said center frequency, the second device exhibiting also a triple transit echo, one of the pairs of combs of each device being apodized, the other ones of the pairs of combs of the device differing in number of comb fingers; and circuit means for connecting the second transducer of the first device to the first transducer of the second device to obtain a filter cascade in which the said pass bands coincide and are being cascaded, the triple transit echo in one of the devices being out of phase of the triple transit echo of the respective other one of the devices and vice versa.

28. In combination for providing a band pass filtering of signals, first means constituting at least a pair of arrays constructed for the transmission of surface waves between the arrays of the pair, the surface wave having first particular phase and frequency characteristics and for transmitting bulk waves having second particular phase and frequency characteristics different from the first particular phase and frequency characteristics, second means constituting at least a pair of arrays constructed for the transmission of surface waves between the arrays of the pair, the surface waves having the first particular phase and frequency characteristics and for transmitting bulk waves having third particular phase and frequency characteristics different from the first and second phase and frequency characteristics; and means connecting the first and second means in a relationship to reinforce the passage of the first particular phase and frequency characteristics of the surface waves from the first and second means and to inhibit the passage of the bulk waves through both of said first and second means.

29. The combination set forth in claim 28, wherein the first and second means are connected in a cascade relationship.

30. A combination as set forth in claim 29, wherein the first means includes a first piezoelectric wafer and at least three arrays of interdigitized contact fingers disposed on the wafer and interrelated electrically to define three transducers, two of the three transducers being connected electrically to each other and operatively coupled by the surface waves and bulk waves to the third transducer, and the second means includes a second piezoelectric wafer and at least three arrays of interdigitized fingers interrelated electrically to define three transducers, two of the three transducers being connected electrically to each other and operatively coupled by the surface waves and the bulk waves to the third transducer.

31. The combination set forth in claim 30, wherein the third transducer in each of the first and second means is apodized to minimize the effects of side lobes in the filter.

32. The combination set forth in claim 30, wherein the first and second transducers in the first means is provided with a different number of fingers than the first and second transducers in the second means.

33. The combination set forth in claim 30, wherein the first and second transducers in the first means is provided with the same disposition and wherein the first and second transducers in the second means is provided with opposite dispositions to provide a phase displacement between the surface waves from the first and second transducers in the second means and wherein means are displaced from the second transducer in the second means but are operatively coupled to the second transducer in the second means to shift the phase of the surface waves from the second transducer in the second means into coincidence with the phase of the surface waves from the first transducer in the second means.

34. A surface acoustic wave filter for electrical signals comprising:
a first surface acoustic wave device having a particular frequency response to surface waves and another particular frequency response to bulk waves;
a second surface acoustic wave device having the same frequency response to surface waves as said first device response to surface waves and a frequency response to bulk waves which response is different than the frequency response of said first device to bulk waves, said first and second acoustic devices each comprising a central transducer and two outer transducers, located adjacent to the ends of said central transducer, each of said transducers being comprised of interdigitized combs, said central transducer having the length of overlap of the teeth of said combs varying from a maximum at the center of said central transducer, to a minimum on each side of said maximum, thence to a maximum followed by a minimum followed by sudden jump in overlap at the ends of said central transducer; and
means coupling the output of one of said devices to the input of the other, whereby frequency response to surface waves is improved and rejection of frequencies of bulk waves is also improved.

35. The combination recited in claim 34, wherein the bulk wave response for one of said devices is at or near minimum at frequencies for which the bulk wave response of the other device is at or near maximum.

36. A surface acoustic wave filter for electrical signals, comprising:
a first acoustic surface wave device, having at least two transducers coupled to each other by a piezoelectric body, at first one of the two transducers receiving an electrical signal, the other of the two transducers generating an electrical signal in response to surface waves generated by the first transducer and transmitted by the pieozoelectric body, the device having a particular frequency response to surface waves, said frequency response determined by one or more of, transducer electrode number, spacing, length and width, the device having an additional frequency response different from the said particular frequency on account of bulk waves;
a second acoustic surface wave device having at least two transducers coupled to each other by a piezoelectric body, a first one of the two transducers of the second device receiving an electrical signal, the other one of the two transducers of the second device generating an electrical signal in response to surface waves generated by the first transducer of the second device and transmitted by the piezoelectric body thereof, the first and second devices having substantially similar frequency response with regard to surface waves but differing frequency responses with regard to bulk waves; and
circuit means for coupling the output from the second transducer of the first device to the first transducer of the second device to obtain a filter cascade in which the said particular frequency responses of said devices coincide and thus are cascaded and the bulk wave responses of said devices do not coincide and thus are not cascaded.

37. A surface acoustic wave filter for electrical signal comprising:
a first surface acoustic wave device having a central transducer and two outer transducers located adjacent to the ends of the central transducer on the surface of a piezoelectric body, each of said tranducers comprised of interdigitized combs;
said central transducer having the length of overlap of the teeth of said combs varying from a maximum at the center of said central transducer, to a minimum on each side of said maximum, thence to a maximum followed by a minimum in the two directions toward the ends of said central transducer, there being a jump in overlap at the ends.

* * * * *